US007298100B2

(12) United States Patent
Kataoka

(10) Patent No.: US 7,298,100 B2
(45) Date of Patent: Nov. 20, 2007

(54) DRIVING APPARATUS FOR VIBRATION TYPE ACTUATOR AND DRIVING METHOD FOR VIBRATION TYPE ACTUATOR

(75) Inventor: Kenichi Kataoka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 213 days.

(21) Appl. No.: 10/554,658

(22) PCT Filed: Jun. 10, 2005

(86) PCT No.: PCT/JP2005/011175

§ 371 (c)(1), (2), (4) Date: Oct. 25, 2005

(87) PCT Pub. No.: WO2005/124989

PCT Pub. Date: Dec. 29, 2005

(65) Prior Publication Data

US 2007/0114955 A1 May 24, 2007

(30) Foreign Application Priority Data

Jun. 15, 2004 (JP) ............................ 2004-177303
May 17, 2005 (JP) ............................ 2005-143923

(51) Int. Cl.
*H02K 33/00* (2006.01)

(52) U.S. Cl. .................. 318/114; 310/316.03; 310/317

(58) Field of Classification Search ................ 318/114
See application file for complete search history.

(56) References Cited

U.S. PATENT DOCUMENTS 5,130,598 A * 7/1992 Verheyen et al. ...... 310/316.03
6,954,022 B2 * 10/2005 Kataoka .................... 310/317
2003/0006722 A1 * 1/2003 Hayashi ..................... 318/114

* cited by examiner

*Primary Examiner*—Lincoln Donovan
*Assistant Examiner*—Michael Brandt
(74) *Attorney, Agent, or Firm*—Cowan, Liebowitz & Latman, P.C.

(57) ABSTRACT

A driving apparatus for a vibration type actuator is disclosed, which can boost the power source voltage and can reduce the cost and the size of the apparatus. The driving apparatus comprises an inductor being connected to a power source, a pulse generation circuit generating a first and second pulse signals that have a phase difference; a first switching element switching a supply operation for supplying the energy accumulated in the inductor to the electro-mechanical energy conversion element according to the first pulse signal; and a second switching element switching a discharge operation for discharging the energy accumulated in the electro-mechanical energy conversion element according to the second pulse signal.

21 Claims, 11 Drawing Sheets

DRIVING APPARATUS FOR VIBRATION TYPE ACTUATOR AND DRIVING METHOD FOR VIBRATION TYPE ACTUATOR

TECHNICAL FIELD

The present invention relates to the driving control of a vibration type actuator including a vibrator and a contacting member that are relatively moved.

BACKGROUND ART

To drive a vibration type actuator, an alternating driving voltage having a frequency of several tens of KHz and a voltage of several tens of Vpp is required. Therefore, in Japanese Patent Laid-Open application No. 2002-15919, a high voltage generation circuit is disclosed, which uses a low-voltage power source such as a battery, generates a high direct voltage once by a DC-DC converter, and supplies it to a driving circuit that generates the driving voltage. The output of the driving circuit is supplied to an electro-mechanical energy conversion element (piezoelectric element) via an inductor. Thereby, the alternative driving voltage amplified with a boosting effect of the inductor is supplied to the electro-mechanical energy conversion element. Further, a structure for boosting the power source voltage, which includes an amplifying circuit with a transformer, is generally used.

On the other hand, there is a vibration type actuator, which reduces the driving voltage by laminating the piezoelectric elements instead of use of the above-mentioned high voltage generation circuit.

However, the method using the laminated piezoelectric elements and the method for boosting the power source voltage using the DC-DC converter or the transformer increase the cost and the size of the driving circuit. In addition, using the laminated piezoelectric elements has a tendency to reduce the driving efficiency slightly in comparison with a single layer piezoelectric element.

DISCLOSURE OF INVENTION

An object of the present invention is to provide a driving apparatus and a driving method for a vibration type actuator, which can boost the power source voltage and can reduce the cost and the size of the apparatus.

A driving apparatus as an aspect of the present invention for a vibration type actuator including a vibrator in which a vibration is generated by an electro-mechanical energy conversion element, and a contacting member which contacts with the vibrator and is moved by the vibration generated in the vibrator, comprises: an inductor, which is connected to a power source; a pulse generation circuit, which generates a first pulse signal and a second pulse signal that have a phase difference; a first switching element, which switches a supply operation for supplying the energy accumulated in the inductor to the electro-mechanical energy conversion element according to the first pulse signal; and a second switching element, which switches a discharge operation for discharging the energy accumulated in the electro-mechanical energy conversion element according to the second pulse signal.

A driving apparatus as another aspect of the present invention for a vibration type actuator including a vibrator in which a vibration is generated by an electro-mechanical energy conversion element, and a contacting member which contacts with the vibrator and is moved by the vibration generated in the vibrator, comprises: an inductor, which is connected to a power source; a condenser, which is connected in parallel with the electro-mechanical energy conversion element; a pulse generation circuit, which generates a first pulse signal and a second pulse signal that have a phase difference; a first switching element, which switches a supply operation for supplying the energy accumulated in the inductor to the condenser according to the first pulse signal; and a second switching element, which switches a discharge operation for discharging the energy accumulated in the condenser according to the second pulse signal.

A driving method as another aspect of the present invention for a vibration type actuator including a vibrator in which a vibration is generated by an electro-mechanical energy conversion element, and a contacting member which contacts with the vibrator and is moved by the vibration generated in the vibrator, comprises: a pulse generation step of generating a first pulse signal and a second pulse signal that have a phase difference; a step of switching a supply operation for supplying the energy accumulated in an inductor, which is connected to a power source, to the electro-mechanical energy conversion element according to the first pulse signal; and a step of switching a discharge operation for discharging the energy accumulated in the electro-mechanical energy conversion element according to the second pulse signal.

A driving method as yet another aspect of the present invention for a vibration type actuator including a vibrator in which a vibration is generated by an electro-mechanical energy conversion element, and a contacting member which contacts with the vibrator and is moved by the vibration generated in the vibrator, comprises: a pulse generation step of generating a first pulse signal and a second pulse signal that have a phase difference; a step of switching a supply operation for supplying the energy accumulated in an inductor, which is connected to a power source, to a condenser that is connected in parallel with the electro-mechanical energy conversion element according to the first pulse signal; and a step of switching a discharge operation for discharging the energy accumulated in the condenser according to the second pulse signal.

Other features and advantages of the present invention will be apparent from the following description taken in conjunction with the accompanying drawings, in which like reference characters designate the same name or similar parts throughout the figures thereof.

BEST MODE FOR CARRYING OUT THE INVENTION

The preferred embodiments of the present invention will be described below with reference to the drawings.

EMBODIMENT 1

Figure 1:
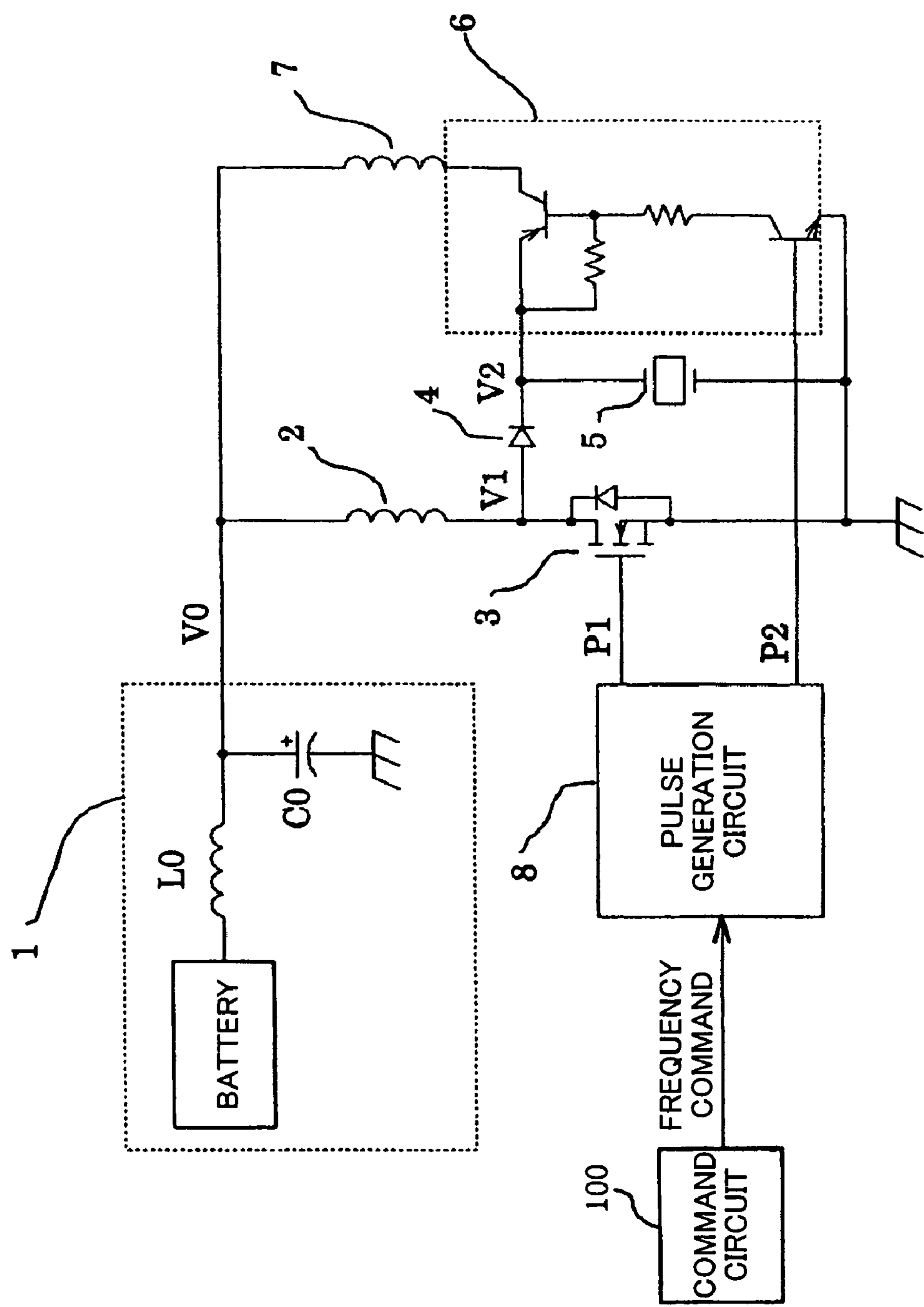
FIG. 1 shows the circuit structure of the driving apparatus of Embodiment 1 of the present invention.

The description will be given of the vibration type actuator that is Embodiment 1 of the present invention. FIG. 1 is a figure showing the circuit structure of the driving apparatus of the present embodiment.

In FIG. 1, reference numeral 1 denotes a power source, and 2 an inductor, which is a first inductor and is connected to the power source 1. Reference numeral 3 denotes a MOSFET, which is a first switching element and switches the line between the inductor 2 and the ground. Reference numeral 4 denotes a diode for transferring the energy accumulated in the inductor 2 in a state in which the MOSFET 3 is ON to a piezoelectric element described later.

Figure 6:
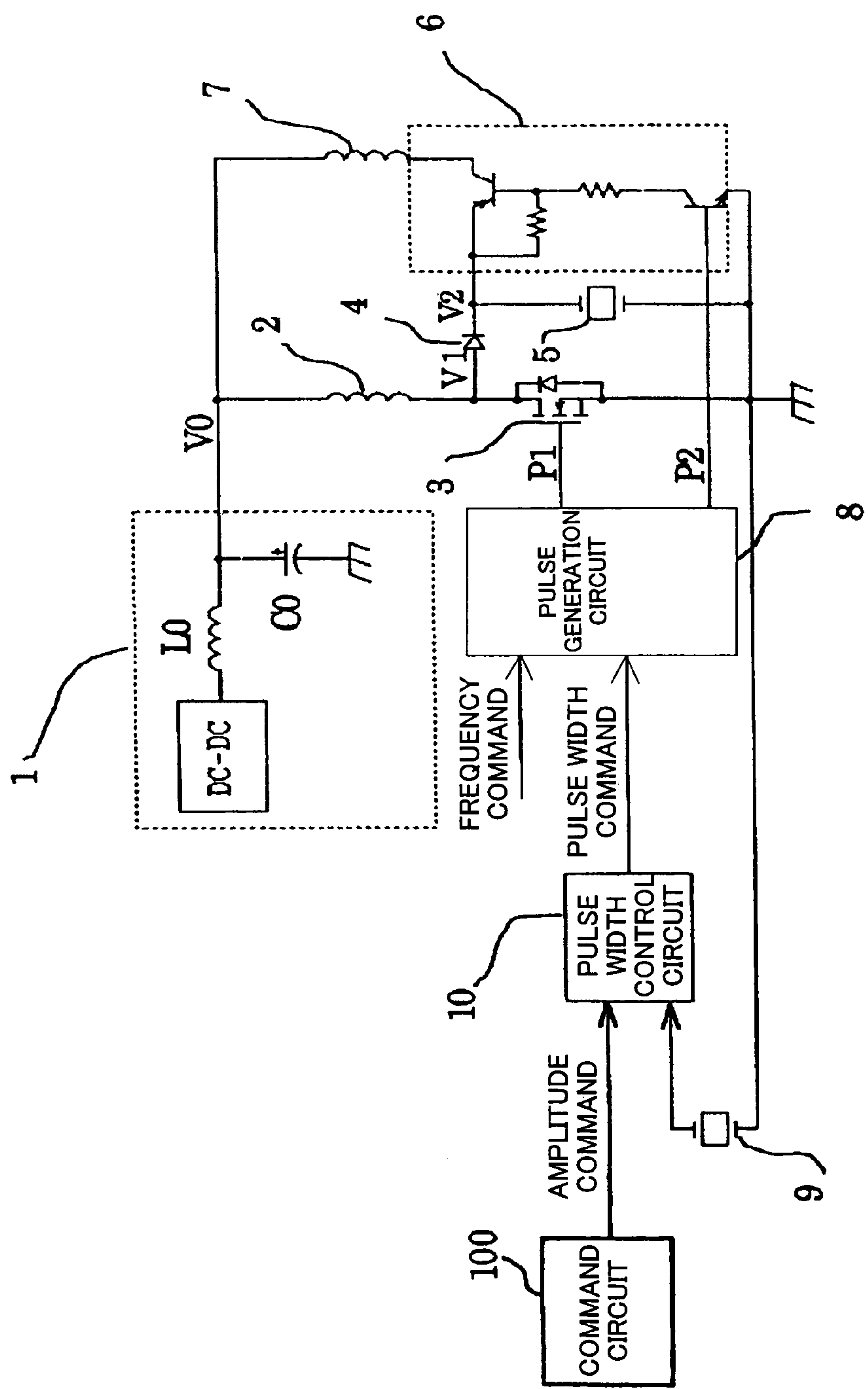
FIG. 6 shows the circuit structure of the driving apparatus of Embodiment 3 of the present invention.

Reference numeral 5 denotes the piezoelectric element (electro-mechanical energy conversion element), which constitutes part of a vibrator, not shown in FIGS. 1, and 6 a switching circuit, which makes the after-mentioned inductor 7 discharge the energy that has been accumulated in the piezoelectric element 5. Reference numeral 7 denotes the inductor, which is disposed between the switching circuit 6 and the power source 1.

Reference numeral 8 denotes a pulse generation circuit, which generates a plurality of pulse signals (P1 and P2) each having a frequency in the vicinity of the resonance frequency of the vibrator and higher than the resonance frequency according to a frequency command from the command circuit 100, and outputs these pulse signals to the MOSFET 3 and the switching circuit 6. The Command from the command circuit 100 is used for controlling the vibration amplitude of the vibrator.

Figure 2:
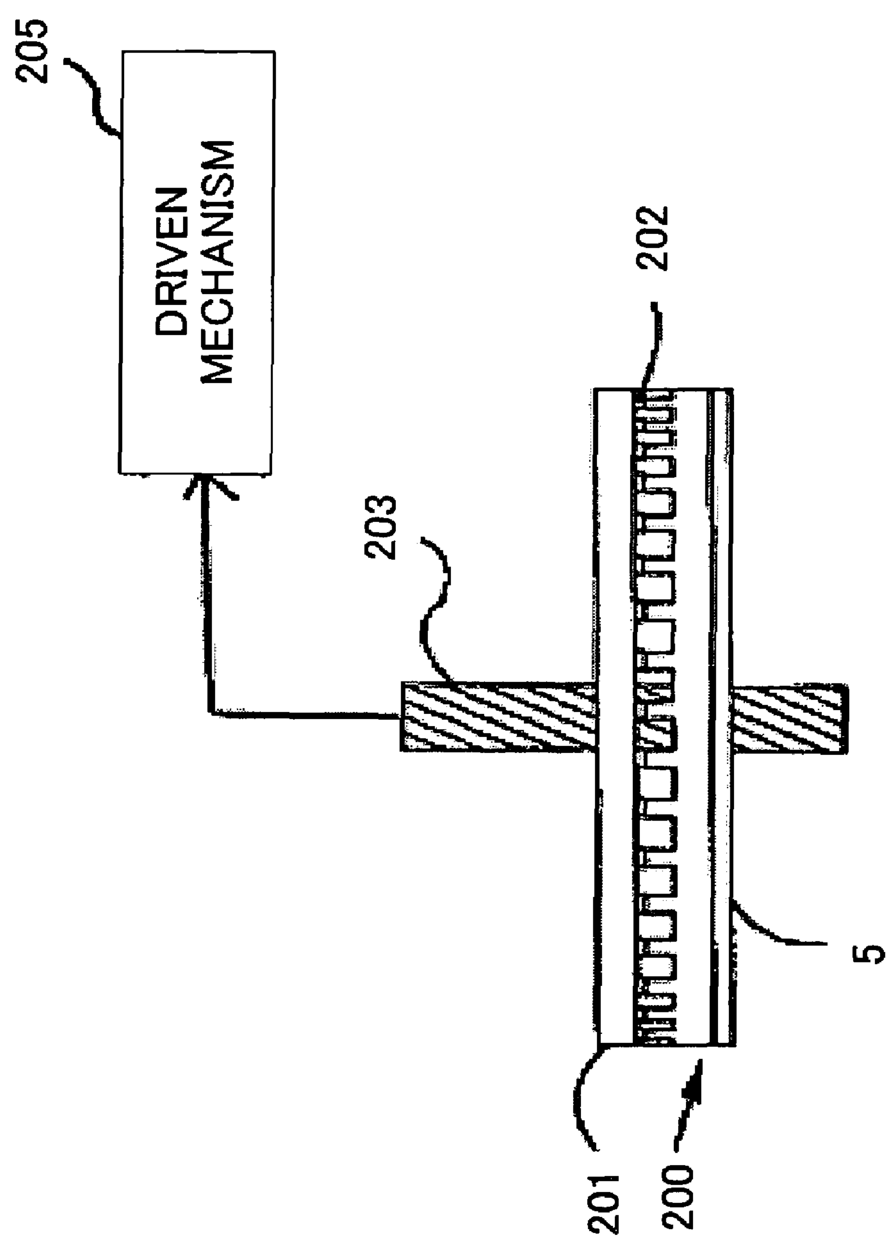
FIG. 2 shows the structure of the vibration type actuator.

FIG. 2 is a figure showing the structure of the vibration type actuator.

In FIG. 2, reference numeral 200 denotes a ring-shaped vibrator. Reference numeral 201 denotes a rotor, which is a contacting member. The rotor 201 contacts with the vibrator under pressure, and is rotated by a traveling vibration wave formed on the vibrator 200. Reference numeral 202 denotes a friction member, which is disposed between the vibrator 200 and the rotor 201, and is bonded to a protruding contact portion of the vibrator 200.

The piezoelectric element 5 is bonded to the vibrator 200, and forms the traveling vibration wave on the vibrator 200 by receiving alternating signals having a phase difference. Reference numeral 203 denotes a rotating shaft, which is connected to the rotor 201. The rotating shaft 203 is rotated by the rotation of the rotor 201, and the torque is transmitted to a driven mechanism 205 via a transmission mechanism, not shown in the figure.

Thereby, the driven mechanism 205 is driven. Here, the driven mechanism 205 includes a lens unit, a photoconductive drum or carrying mechanism of an image forming apparatus, or the like. Although a ring-shaped vibration type actuator is shown in FIG. 2, other vibration type actuators such as a rod-shaped vibration type actuator may be used.

Figure 3:
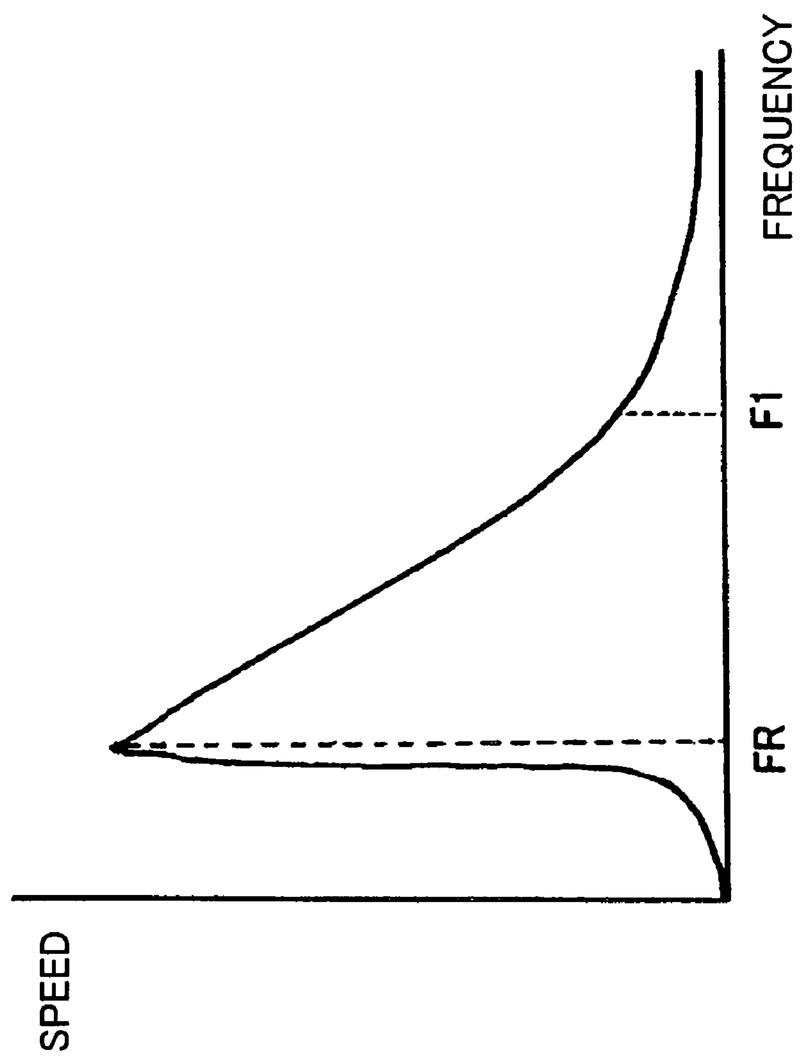
FIG. 3 shows the frequency-speed characteristics of the vibration type actuator.

FIG. 3 is a chart showing the relationship between the driving frequency of a common vibration type actuator and the relative speed between the vibrator and the rotor. The horizontal axis denotes the driving frequency, and vertical axis denotes the rotational speed of the rotor 201.

The drive of the vibration type actuator is controlled in a frequency range higher than the resonance frequency FR shown in FIG. 3 normally. In other words, the drive is started at the frequency F1 higher than the resonance frequency FR, and the rotational speed is increased by bringing the driving frequency close to the resonance frequency FR. The rotational speed is proportional to the amplitude of the vibrator 200. Therefore, FIG. 3 also shows the characteristic of the vibration amplitude to the driving frequency.

Figure 4:
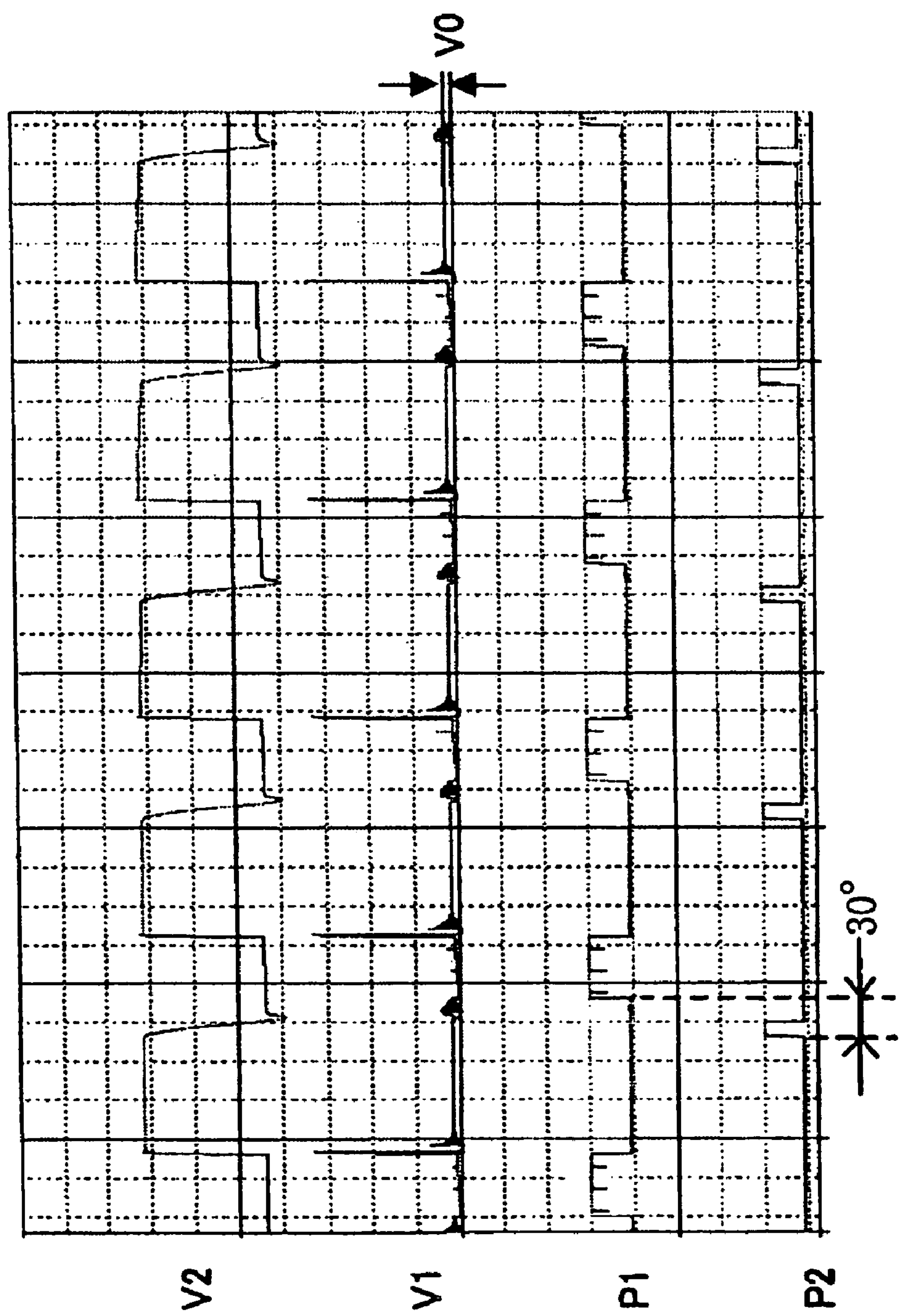
FIG. 4 shows the waveforms in each part of the driving apparatus.

FIG. 4 shows waveforms in each part of the circuit shown in FIG. 1. The description will be given of the operation of the driving apparatus of the present embodiment using FIGS. 3 and 4.

The signal P1 is a pulse signal that is input to the gate of the MOSFET 3 from the pulse generation circuit 8; the signal P1 has a frequency higher than the resonance frequency of the vibrator 200. A pulse signal having the frequency F1, shown in FIG. 3, and a duty ratio of 28%, for example, is used as the signal PI when the operation of the driving apparatus is started.

V1 denotes the drain voltage of the MOSFET 3. The voltage V1 is zero during the ON state of the signal P1 because the MOSFET 3 is shorted to the ground. The voltage V1 increases to a voltage higher than the voltage V0 of the power source 1 during the OFF state of the signal P1 because the MOSFET 3 becomes the OFF state.

V1 denotes the input voltage to the piezoelectric element 5. The energy accumulated in the inductor 2 during the ON state of the MOSFET 3 is transferred to the piezoelectric element 5 via the diode 4 by switching the MOSFET 3 to the OFF state, and thereby increasing the voltage V2 to a voltage higher than the voltage V0 of the power source 1.

Since this voltage amplifying effect makes it possible to input a sufficient voltage to the vibrator 200 (piezoelectric element 5), a large vibration can be generated even if a power source voltage is low. The circuit structure of the present embodiment becomes simpler than a case where a booster circuit such as a DC-DC converter is used because a voltage controller is not required. Therefore, a low-cost and compact driving apparatus can be achieved.

Next, the operation to discharge the energy transferred to the piezoelectric element 5 will be explained.

The signal P2, which is a discharge command signal, is generated in synchronization with the signal P1. The signal P2 has a phase difference of 30 degrees with respect to the signal P1. The duty ratio of the signal P2 is 5%, and the ON period (time) of the signal P2 is shorter than that of the signal P1.

The switching circuit 6 is switched to the ON state during the ON period of the signal P2. Thereby, the energy accumulated in the piezoelectric element 5 is transferred to the inductor 7, and then transferred to the power source 1. The filter circuit included in the power source 1 and constituted by an inductor L0 and a condenser C0 can sufficiently cut the vibration frequency of the vibration type actuator, and most of the electric current of the vibration frequency component flows to the condenser C0.

The cycles of the signals P1 and P2 are the same because the signals P1 and P2 are formed by the pulse signals generated in the pulse generation circuit 8. The voltage V2 input to the piezoelectric element 5 becomes an alternating signal that repeats increasing and decreasing like a sine wave by switching the signals P1 and P2 alternately to the ON state. Further, the amount of the energy transferred to the piezoelectric element 5 can be changed by changing the phase difference between the signals P1 and P2. Thereby, it becomes possible to control the vibration amplitude of the vibrator 200.

As described above, in the present embodiment, the pulse generation circuit 8, which receives the frequency command from the command circuit 100, generates the signals P1 and P2. In other words, the booster circuit (the inductor 2 and MOSFET 3) that inputs the amplified voltage V2 to the piezoelectric element 5 and the discharge circuit (the switching circuit 6) that discharges the energy transferred to the piezoelectric element 5 are controlled using the same driving command for the vibration type actuator. Therefore, it is possible to make the circuit structure simple.

EMBODIMENT 2

Figure 5:
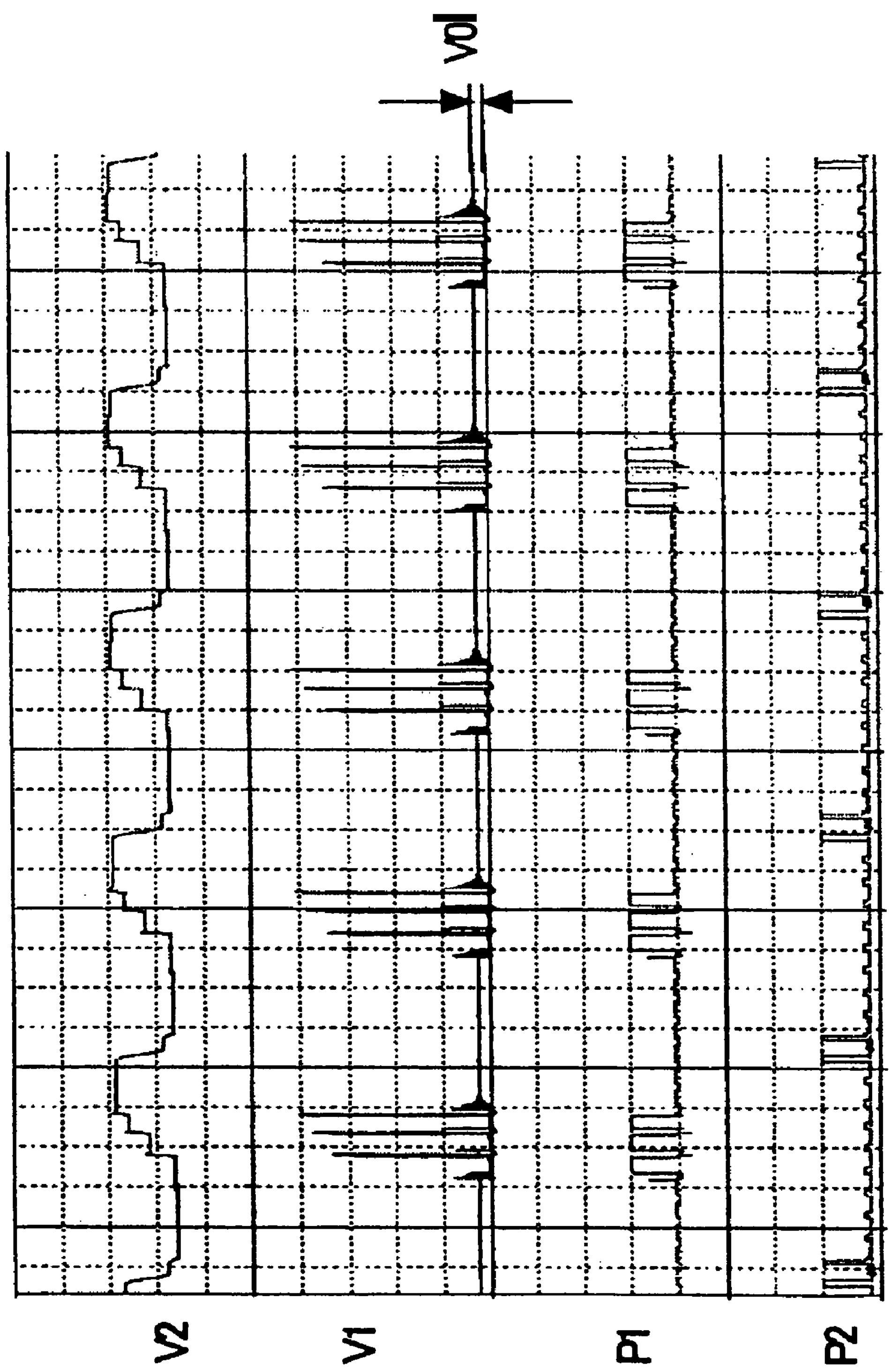
FIG. 5 shows the waveforms in each part of the driving apparatus of Embodiment 2 of the present invention.

FIG. 5 shows the waveform in each part of the circuit constituting the driving apparatus for the vibration type actuator, which is Embodiment 2 of the present invention. The circuit structure of the driving apparatus of the present embodiment is the same as that of Embodiment 1 shown in FIG. 1, and the signals P1 and P2 and the voltages V1 and V2 are the same as those of Embodiment 1.

In Embodiment 1, the signals P1 and P2 are switched to the ON state once in one cycle of the resonance frequency of the vibrator 200 as shown in FIG. 4. On the other hand, in the present embodiment, the signals P1 and P2 are switched to the ON state more than once in one cycle of the resonance frequency of the vibrator 200 as shown in FIG. 4. In other words, there is a period in which the signal P1 is switched to the ON state third times in a half cycle of the resonance frequency of the vibrator 200, and there is a period in which the signal P2 is switched to the ON state twice in the half cycle. In the case where the signal P2 is switched to the ON state more than once after the signal P1 is switched to the ON state more than once like this, the voltage V2 becomes a alternating signal that repeats increasing and decreasing like a sine wave by giving them a phase difference.

Further, by reducing the time of each ON state of the signals P1 and P2, and switching them to the ON state more than once, it is possible to the inductance values of the inductors 2 and 7, and thereby reducing the size of the inductors 2 and 7. Reducing the size of the inductors 2 and 7 makes it possible to miniaturize the circuit constituting the driving apparatus.

EMBODIMENT 3

FIG. 6 is a diagram of the circuit constituting the driving apparatus for the vibration type actuator, which is Embodiment 3 of the present invention. In the present embodiment, the same reference numerals are used for the same constituents as in Embodiment 1.

The driving apparatus of the present embodiment controls the vibration amplitude of the vibrator 200 by changing the pulse width of the signals P1 that is input to the gate of MOSFET 3 and the pulse width of the signals P2.

In FIG. 6, reference numeral 9 denotes a piezoelectric element, which is a vibration detection element. The piezoelectric element 9 constitutes part of the vibrator 200. The piezoelectric element 9 detects the vibration of the vibrator 200, and outputs the signal waveform corresponding to the vibration. Reference numeral 10 denotes a pulse width control circuit (controller), which compares the output signal from the piezoelectric element 9 with an amplitude command from the command circuit (CPU) 100, and determines the pulse widths of the signals P1 and P2 based on the comparison result. Then, the pulse width control circuit 10 outputs a pulse width command for generating the signals P1 and P2 having the determined pulse widths to the pulse generation circuit 8.

Figure 7:
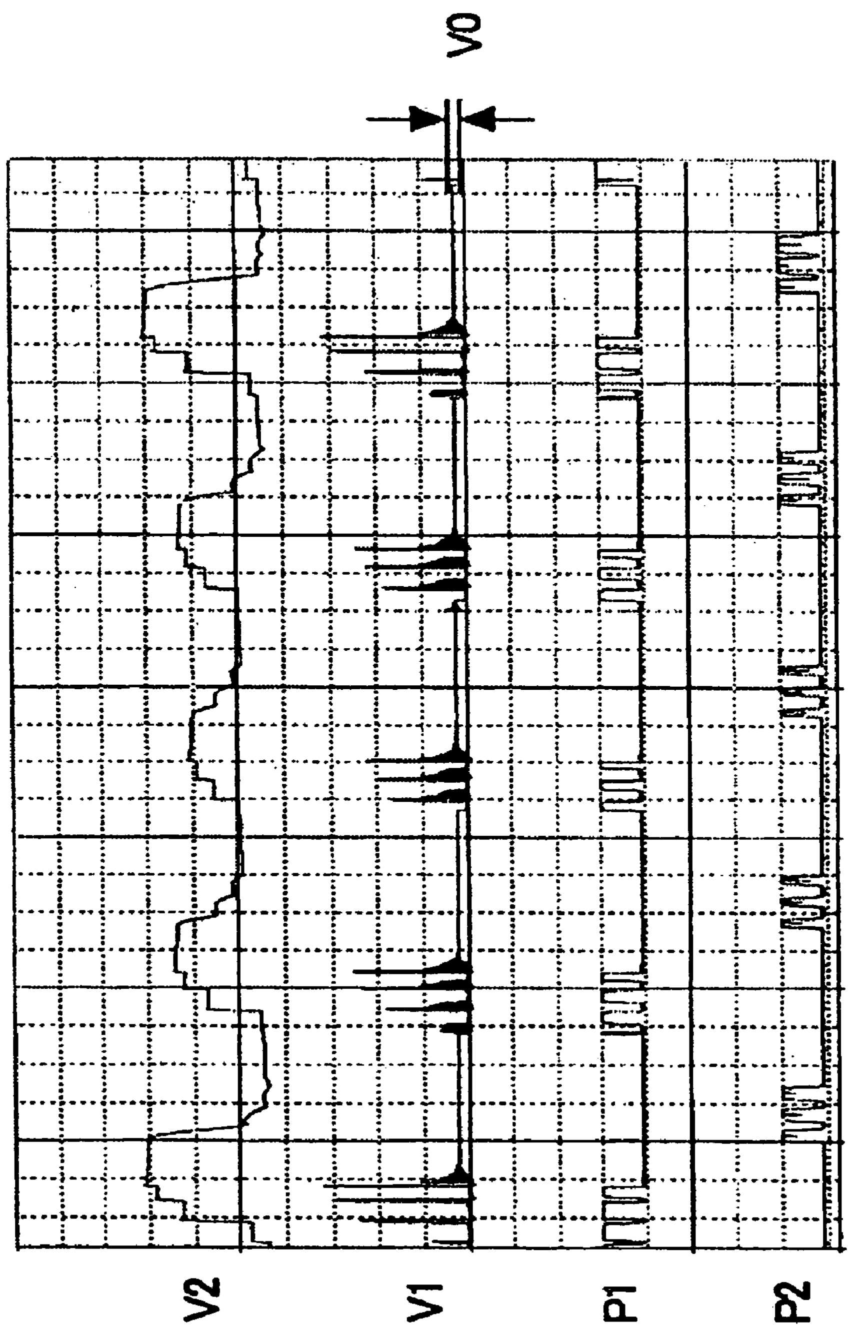
FIG. 7 shows the waveforms in each part of the driving apparatus of Embodiment 3.

FIG. 7 shows an appearance in which the pulse widths of the signals P1 and P2 are changed according to the pulse width command from the pulse width control circuit 10.

The signals P1 and P2 are switched to the ON state more than once in one cycle of the frequency of the main vibration component of the vibrator 200. The pulse width (the period of the ON state) of each of the signals P1 and P2 is set according to the pulse width command from the pulse width control circuit 10, and the signals P1 and P2 control the amplitude of the alternating voltage input to the piezoelectric element 5.

As shown in FIG. 7, the amplitude of the waveform of the voltage V2 is changed according to the change of the pulse widths of the signals P1 and P2.

Although the pulse widths of the signals P1 and P2 are changed for controlling the vibration amplitude in the present embodiment, the vibration amplitude can be controlled by changing the frequency of the signals P1 and P2 (the frequency of the main vibration component of the vibrator 200). This is apparent from the graph in FIG. 3 showing the relationship between the frequency and the driving speed.

Furthermore, an example has been described, in which the vibration amplitude of the vibrator 200 is controlled in this embodiment. In contrast, the speed control of the vibration type actuator can be performed by detecting the speed instead of the vibration because the driving speed is proportional to the vibration amplitude.

EMBODIMENT 4

Figure 8:
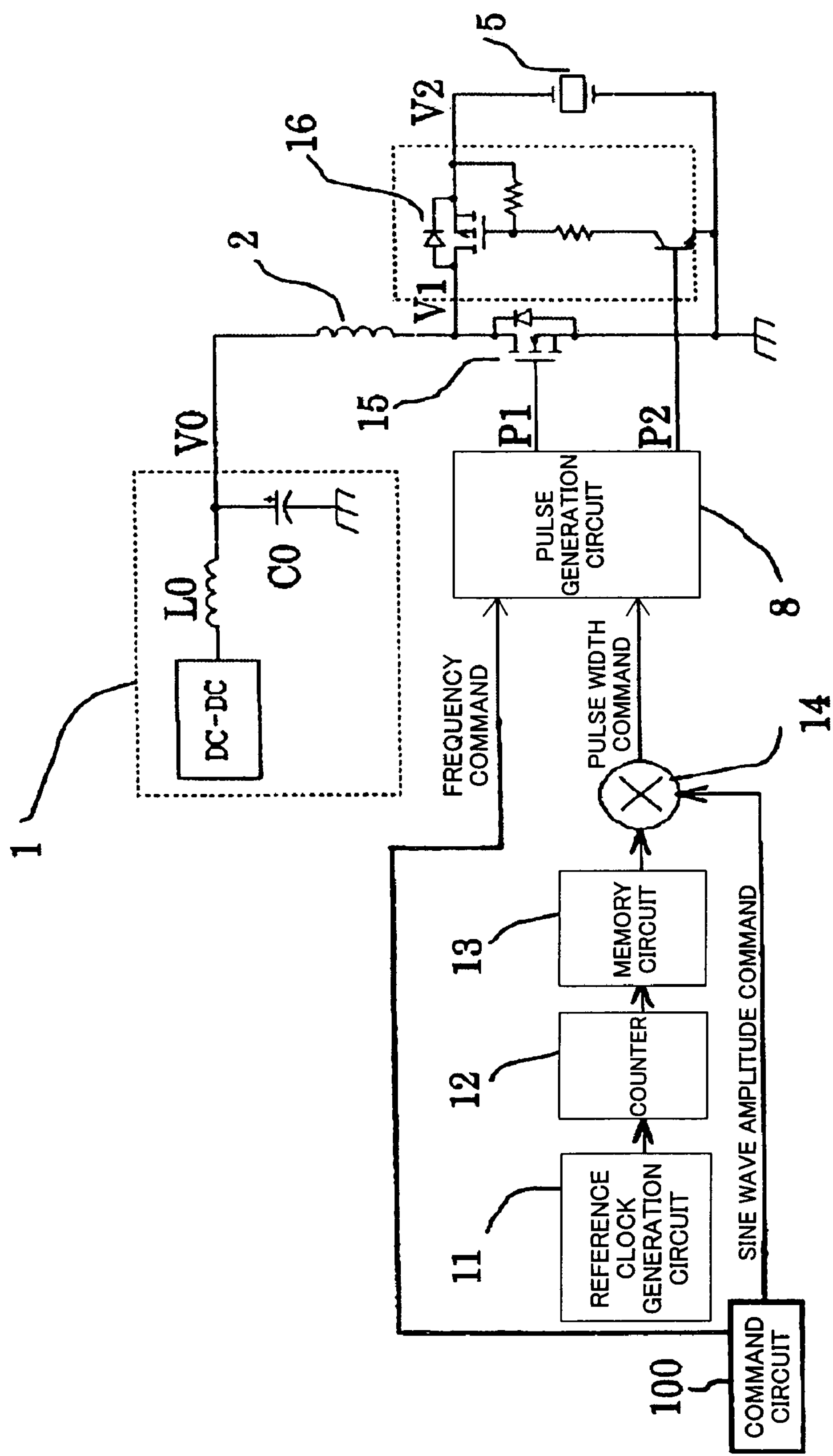
FIG. 8 shows the circuit structure of the driving apparatus of Embodiment 4 of the present invention.

FIG. 8 is a figure showing the circuit structure of the driving apparatus for the vibration type actuator, which is Embodiment 4 of the present invention. In the present invention, the inductor 2 has a function of both the inductor 2 and the inductor 7 in Embodiment 1, and thereby reducing the number of the inductor and miniaturizing the circuit constituting the driving apparatus.

Furthermore, although the pulse widths of the signals P1 and P2 are controlled according to the pulse width command from the pulse width control circuit 10 in Embodiment 3, the pulse widths thereof are set according to the after-mentioned waveform data stored in a memory circuit in the present embodiment.

The concrete description will be given of the driving apparatus of the present invention as follows. In FIG. 8, the same reference numerals are used for the same constituents as in Embodiment 1.

Reference numeral 11 denotes a reference clock generation circuit, which generates a reference clock signal, 12 a counter, which counts the reference clock signal output from the reference clock generation circuit 11. Reference numeral 13 denotes the memory, which stores data and outputs a piece of the data according to the count value of the counter 12.

The waveform data, which are the above-mentioned data stored in the memory circuit 13 include waveform data relating a sine waveform, a triangular waveform, a composite waveform of them (a composite waveform of sine waveforms, composite waveform of triangular waveforms, or composite waveform of a sine and triangular waveforms), or the like. The memory circuit 13 outputs the waveform data according to the output value (count value) of the counter 12.

Reference numeral 14 denotes a multiplication circuit, which multiplies the waveform data from the memory circuit 13 by a sine wave amplitude command value output from the command circuit 100. After the amplification process for the waveform data according to the sine wave amplitude command value by the multiplication circuit 14 is performed, the amplified waveform data are input to the pulse generation circuit 10 as a pulse width command signal. The pulse width command signal has a positive or negative sign; the positive signal becomes a pulse width command for the signal P1, and the negative signal becomes a pulse width command for the signal P2.

Reference numeral 15 denotes a MOSFET, which is a first switching element, 16 a MOSFET, which is a second switching element. A diode included in the MOSFET 16 is used as a diode for transferring the energy accumulated in the inductor 2 to the piezoelectric element 5.

Figure 9:
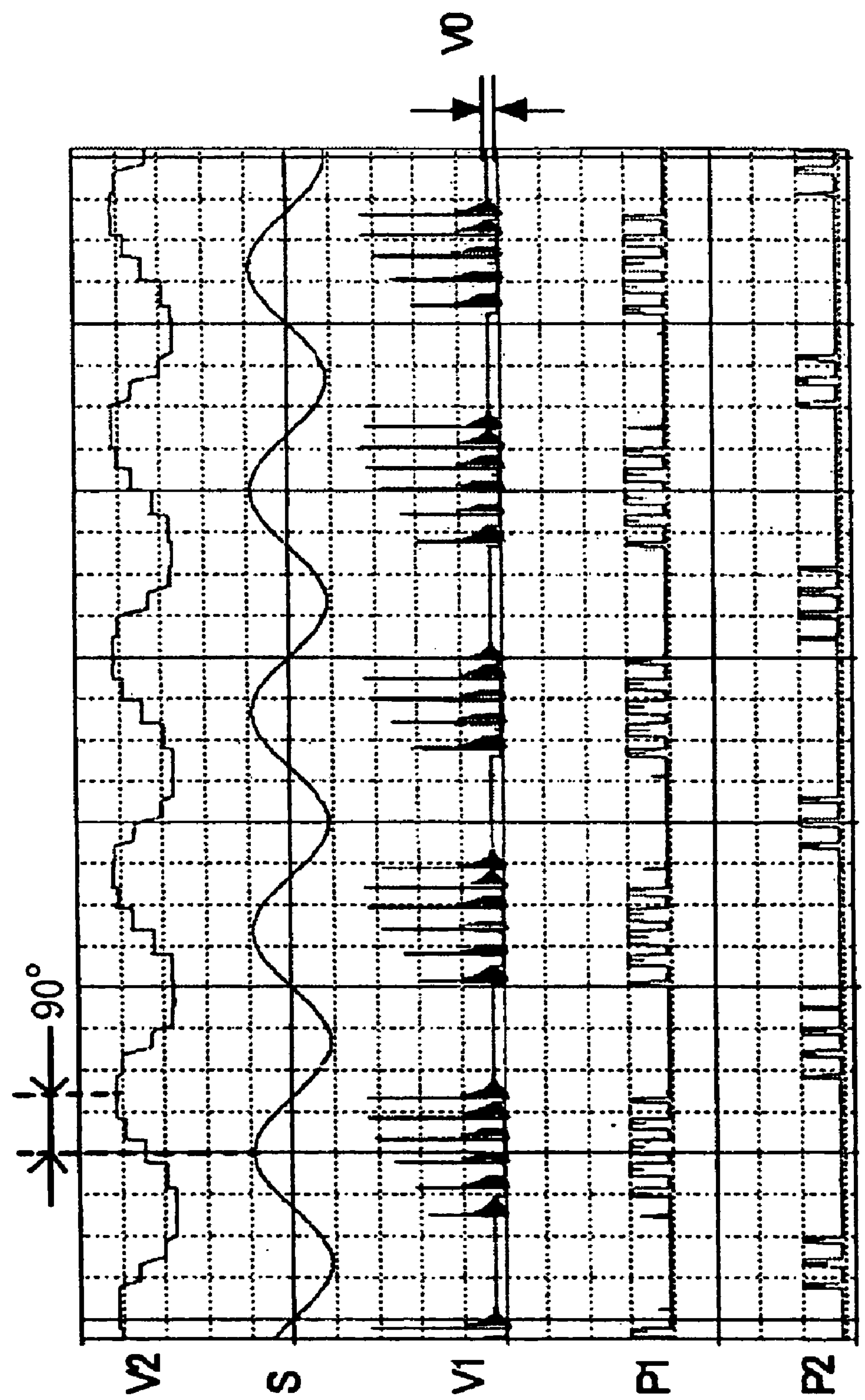
FIG. 9 shows the waveforms in each part of the driving apparatus of Embodiment 4.

FIG. 9 shows the waveform in each part of the circuit shown in FIG. 8. FIG. 9 shows a case where the sine waveform data are output from the memory circuit 13, and shows this sine waveform data as the signal S.

Pulses of the signal P1 are generated in the positive cycle of the signal S; the signal P1 is switched to the ON state five or six times in one positive cycle. The pulse width of the signal P1 increases and decreases according to the change of the signal S, and thereby resulting in the sine-wave like change (the stepwise change along the sine wave) of the waveform of the voltage V2 that is the input voltage to the piezoelectric element 5. The phase of the waveform of the voltage V2 lags behind the signal S by approximately 90 degrees.

Pulses of the signal P2 are generated in the negative cycle of the signal S; the signal P2 is switched to the ON state three or four times in one negative cycle. The pulse width of the signal P2 also increases and decreases according to the change of the signal S, as the pulse width of the signal P1.

Although the description has been made in the case where the sine waveform data are output from the memory circuit 13, if other waveform data stored in the memory circuit 13 can be output, any voltage according to the other waveform data (voltage having a waveform that changes stepwise along the waveform data) can be input to the piezoelectric element 5.

Furthermore, by providing a plurality of memory circuits, a waveform having a complicated shape can be formed using the waveform data output from these memory circuits.

According to the present embodiment, it is possible to change the waveform of the voltage V2 input to the piezoelectric element 5 freely by changing (increasing and decreasing) the pulse width of the signal P1 according to the signal S. Thereby, it is possible to generate a waveform bringing good driving efficiency to the vibration type actuator. Further, it is possible to simultaneously generate a plurality of different vibrations in the vibrator 200 if using the above-mentioned composite waveform data.

EMBODIMENT 5

Figure 10:
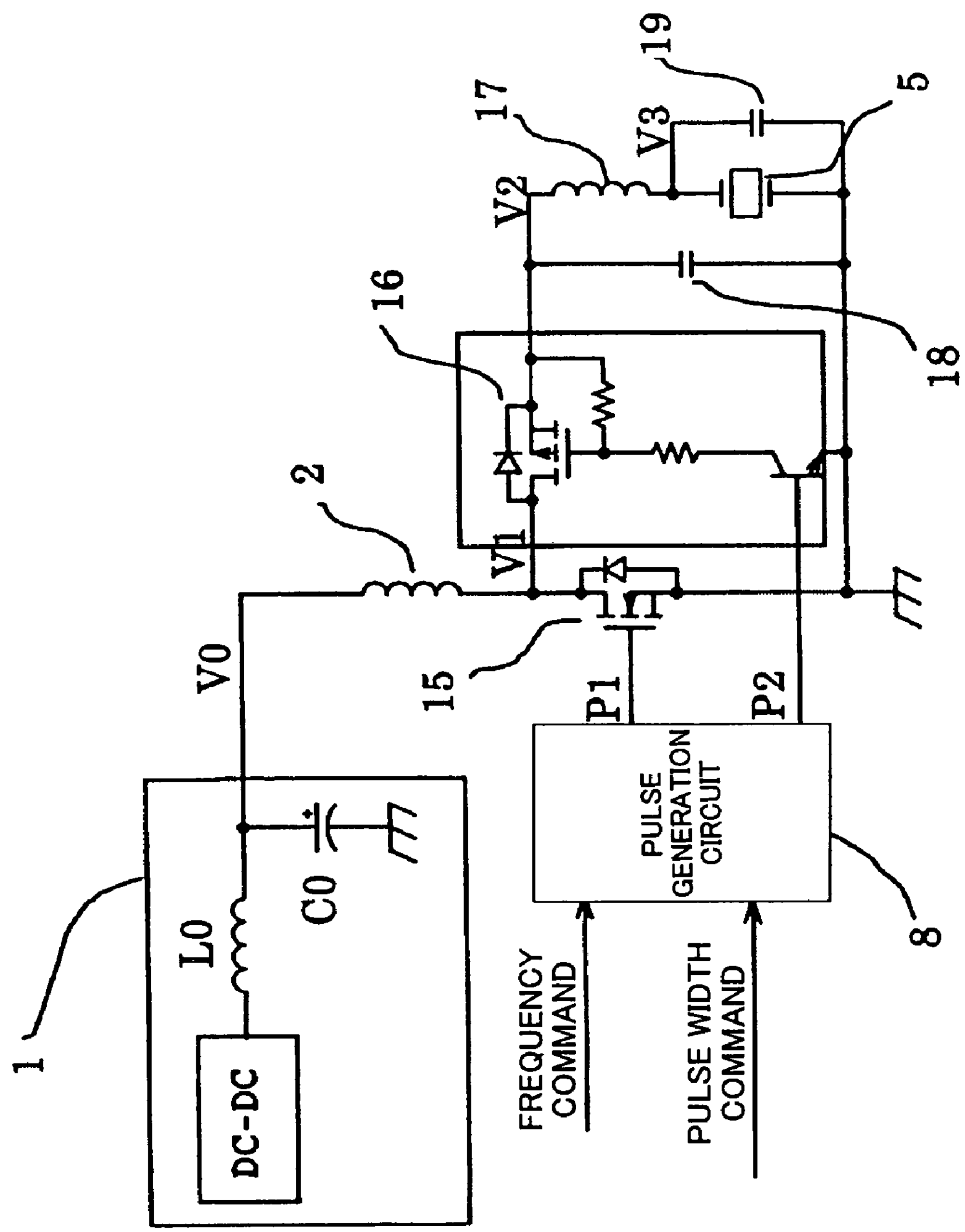
FIG. 10 shows the circuit structure of the driving apparatus of Embodiment 5 of the present invention.

FIG. 10 is a figure showing the circuit structure of the driving apparatus for the vibration type actuator of Embodiment 5 of the present invention. In FIG. 10, the same reference numerals are used for the same constituents as in Embodiments 1 and 4.

In Embodiment 4, the piezoelectric element 5 is connected to the MOSFET 6. In contrast, in the present embodiment, a condenser 18 is connected to the MOSFET 6, and the inductor 17 is connected between the condenser 18 and the piezoelectric element 5. Further, a capacity-adjusting condenser 19 is connected in parallel with the piezoelectric element 5.

It is possible to make the waveform of the alternating voltage input to the piezoelectric element 5 be a smooth waveform having a small distortion by the filter effect and the boosting effect of the inductor 17, and to amplify its amplitude. Therefore, it is possible to reduce the drain-to-source voltage of the MOSFET 15, and thereby using a low withstand voltage MOSFET as the MOSFET 15.

The inductance value of the inductor 17 and the condenser 18 are matched in impedance, and the matching frequency is set to a frequency higher than the resonance frequency of the vibrator 200 shown in FIG. 2.

Figure 11:
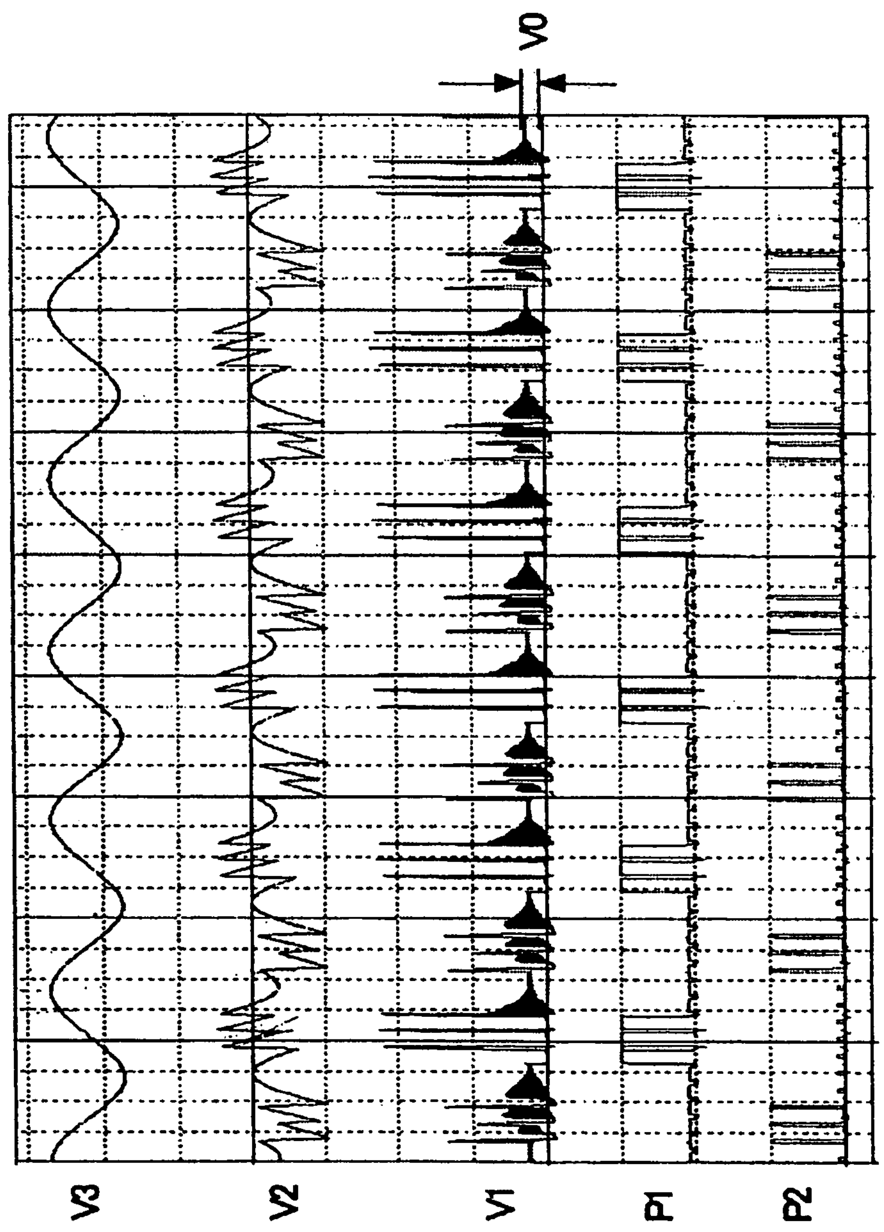
FIG. 11 shows the waveforms in each part of the driving apparatus of Embodiment 5.

FIG. 11 shows the waveform of each part of the circuit shown in FIG. 10.

Each of the signals P1 and P2 is a pulse train signal that is switched to the ON state three times in one cycle, and the pulse width of the signal P2 is shorter than that of the signal P1.

The voltage V1 denotes the drain voltage of the MOSFET 15; the peak of the voltage V1 is kept relatively low by the boosting effect of the inductor 17 and the like. The voltage V2 denotes the terminal voltage of the condenser 18; the waveform thereof is a waveform that multiple parts of a sine wave are pieced. The voltage V3 denotes the voltage input to piezoelectric element 5; the waveform thereof is a sine wave.

The entire disclosure of Japanese Patent Applications Nos. 2004-177303, filed on Jun. 15, 2004, and 2005-143923, filed on May 17, 2005, including claims, specification, drawings, and abstract are incorporated herein by reference in its entirety.

As many apparently widely different embodiments of the present invention can be made without departing from the spirit and scope thereof, it is to be understood that the invention is not limited to the specific embodiments thereof except as defined in the appended claims.

The invention claimed is:

1. A driving apparatus for a vibration type actuator including a vibrator in which a vibration is generated by an electro-mechanical energy conversion element, and a contacting member which contacts with the vibrator and is moved by the vibration generated in the vibrator, the driving apparatus comprising:

an inductor, which is connected to a power source;

a pulse generation circuit, which generates a first pulse signal and a second pulse signal that have a phase difference;

a first switching element, which switches a supply operation for supplying the energy accumulated in the inductor to the electro-mechanical energy conversion element according to the first pulse signal; and a second switching element, which switches a discharge operation for discharging the energy accumulated in the electro-mechanical conversion element according to the second pulse signal, wherein the cycle of the first pulse signal is equal to that of the second pulse signal.

2. The driving apparatus according to claim 1, wherein the pulse generation circuit generates the first and second pulse signals according to one of the vibration amplitude of the vibrator and a command for controlling the driving speed of the vibration type actuator.

3. The driving apparatus according to claim 1, wherein the second switching element is disposed between the inductor and the electro-mechanical energy conversion element.

4. The driving apparatus according to claim 1, wherein the first pulse signal includes a plurality of pulse components in one cycle.

5. The driving apparatus according to claim 4, further comprising a memory circuit, which stores waveform data, wherein the pulse generation circuit determines the pulse width of the pulse component based on the waveform data.

6. The driving apparatus according to claim 2, further comprising a command circuit, which outputs a command signal relating the vibration amplitude of the vibrator, wherein the pulse generation circuit generates the first and second pulse signals based on the vibration state of the vibrator detected by a vibration detection element and the command signal.

7. The driving apparatus according to claim 2, further comprising a command circuit, which outputs a command signal relating the driving speed of the vibration type actuator, and a vibration detection circuit, which detects the driving speed of the vibration type actuator, wherein the pulse generation circuit generates the first and second pulse signals based on the detected driving speed and the command signal.

8. A driving apparatus for a vibration type actuator including a vibrator in which a vibration is generated by an electro-mechanical energy conversion element, and a contacting member which contacts with the vibrator and is moved by the vibration generated in the vibrator, the driving apparatus comprising:

an inductor, which is connected to a power source;

a condenser, which is connected in parallel with the electro-mechanical energy conversion element;

a pulse generation circuit, which generates a first pulse signal and a second pulse signal that have a phase difference;

a first switching element, which switches a supply operation for supplying the energy accumulated in the inductor to the condenser according to the first pulse signal; and a second switching element, which switches a discharge operation for discharging the energy accumulated in the condenser according to the second pulse signal.

9. The driving apparatus according to claim 8, wherein the pulse generation circuit generates the first and second pulse signals according to one of the vibration amplitude of the vibrator and a command for controlling the driving speed of the vibration type actuator.

10. The driving apparatus according to claim 8, wherein the second switching element is disposed between the inductor and the electro-mechanical energy conversion element.

11. The driving apparatus according to claim 8, wherein the cycle of the first pulse signal is equal to that of the second pulse signal.

12. The driving apparatus according to claim 11, wherein the first pulse signal includes a plurality of pulse components in one cycle.

13. The driving apparatus according to claim 12, further comprising a memory circuit, which stores waveform data, wherein the pulse generation circuit determines the pulse width of the pulse component based on the waveform data.

14. The driving apparatus according to claim 9, further comprising a command circuit, which outputs a command signal relating the vibration amplitude of the vibrator, wherein the pulse generation circuit generates the first and second pulse signals based on the vibration state of the vibrator detected by a vibration detection element and the command signal.

15. The driving apparatus according to claim 9, further comprising a command circuit, which outputs a command signal relating the driving speed of the vibration type actuator, and a vibration detection circuit, which detects the driving speed of the vibration type actuator, wherein the pulse generation circuit generates the first and second pulse signals based on the detected driving speed and the command signal.

16. A driving method for a vibration type actuator including a vibrator in which a vibration is generated by an electro-mechanical energy conversion element, and a contacting member which contacts with the vibrator and is moved by the vibration generated in the vibrator, the driving method comprising:

a pulse generation step of generating a first pulse signal and a second pulse signal that have a phase difference;

a step of switching a supply operation for supplying the energy accumulated in an inductor, which is connected to a power source, to the electro-mechanical energy conversion element according to the first pulse signal; and a step of switching a discharge operation for discharging the energy accumulated in the electro-mechanical energy conversion element according to the second pulse signal, wherein the cycle of the first pulse signal is equal to that of the second pulse signal.

17. The driving method according to claim 16, wherein, in the pulse generation step, the first and second pulse signals are generated according to one of the vibration amplitude of the vibrator and a command for controlling the driving speed of the vibration type actuator.

18. A driving method for a vibration type actuator including a vibrator in which a vibration is generated by an electro-mechanical energy conversion element, and a contacting member which contacts with the vibrator and is moved by the vibration generated in the vibrator, the driving method comprising:

a pulse generation step of generating a first pulse signal and a second pulse signal that have a phase difference;

a step of switching a supply operation for supplying the energy accumulated in an inductor, which is connected to a power source, to a condenser that is connected in parallel with the electro-mechanical energy conversion element according to the first pulse signal; and a step of switching a discharge operation for discharging the energy accumulated in the condenser according to the second pulse signal.

19. The driving method according to claim 18, wherein, in the pulse generation step, the first and second pulse signals are generated according to one of the vibration amplitude of the vibrator and a command for controlling the driving speed of the vibration type actuator.

20. The driving apparatus according to claim 1, wherein the first switching element is connected to a connection point between the inductor and the electro-mechanical energy conversion element.

21. The driving method according to claim 16, wherein the first switching element is connected to a connection point between the inductor and the electro-mechanical energy conversion element.

* * * * *